(12) United States Patent
Minzoni et al.

(10) Patent No.: US 7,990,798 B2
(45) Date of Patent: Aug. 2, 2011

(54) INTEGRATED CIRCUIT INCLUDING A MEMORY MODULE HAVING A PLURALITY OF MEMORY BANKS

(75) Inventors: Alessandro Minzoni, Xi'an (CN); Werner Obermaier, Xi'an (CN)

(73) Assignee: Qimonda AG, Munich (DE)

( * ) Notice: Subject to any disclaimer, the term of this patent is extended or adjusted under 35 U.S.C. 154(b) by 330 days.

(21) Appl. No.: 11/872,403

(22) Filed: Oct. 15, 2007

(65) Prior Publication Data
US 2009/0097348 A1  Apr. 16, 2009

(51) Int. Cl.
*G11C 8/00* (2006.01)
(52) U.S. Cl. ......... 365/230.03; 365/230.02; 365/233.16; 365/238.1; 365/238.5
(58) Field of Classification Search ............. 365/230.03, 365/230.02, 233.16, 230.06, 238.1, 238.5, 365/51, 63
See application file for complete search history.

(56) References Cited

U.S. PATENT DOCUMENTS

| | | | | |
|---|---|---|---|---|
| 5,966,316 | A * | 10/1999 | Tsukikawa | 365/51 |
| 6,396,766 | B1 * | 5/2002 | Lee | 365/230.03 |
| 2005/0024975 | A1 * | 2/2005 | Gratrex et al. | 365/230.05 |
| 2005/0249015 | A1 * | 11/2005 | Park | 365/230.03 |
| 2006/0250881 | A1 * | 11/2006 | Kandolf et al. | 365/230.05 |
| 2008/0002478 | A1 * | 1/2008 | Park | 365/189.04 |

* cited by examiner

*Primary Examiner* — Pho M Luu
*Assistant Examiner* — Tha-O Bui
(74) *Attorney, Agent, or Firm* — Dicke, Billig & Czaja, PLLC

(57) ABSTRACT

An integrated circuit including a memory module having a plurality of memory banks is disclosed. One embodiment provides an even number of at least four memory banks. Each memory bank has a plurality of memory cells. Each two of the memory bank form a memory bank region and being alternately connected to an m-bit data bus. The memory banks are classified into two groups, each group including a memory bank of each memory bank region. The memory module further includes a selection device connected to the memory banks and being responsive to selection bits. The selection device selects one of the two groups of memory banks and a group of i memory cells within the memory banks of the selected group of memory banks to access the selected i memory cells per one stroke via the associated m-bit data buses of the memory groups including the selected memory banks, m being equal to an integer multiple of i.

8 Claims, 17 Drawing Sheets

| 0/0 | 0/1 | 2/0 | 2/1 | 3/0 | 3/1 |
|-----|-----|-----|-----|-----|-----|
| 1/00 | | 1/10 | 1/01 | | 1/11 |

| 5/00 | 4/0 | 4/1 | 6/0 | 6/1 | 7/0 | 7/1 |
|------|-----|-----|-----|-----|-----|-----|
| | | | 5/10 | 5/01 | | 5/11 |

FIG 9

| 0/0 | 0/1 | 4/0 | 4/1 | 6/0 | 6/1 |
| 2/00 | 2/10 | | | 5/00 | 5/10 |

| 2/01 | 2/11 | 3/0 | 3/1 | 5/01 | 5/11 |
| 1/0 | 1/1 | | | 7/0 | 7/1 |

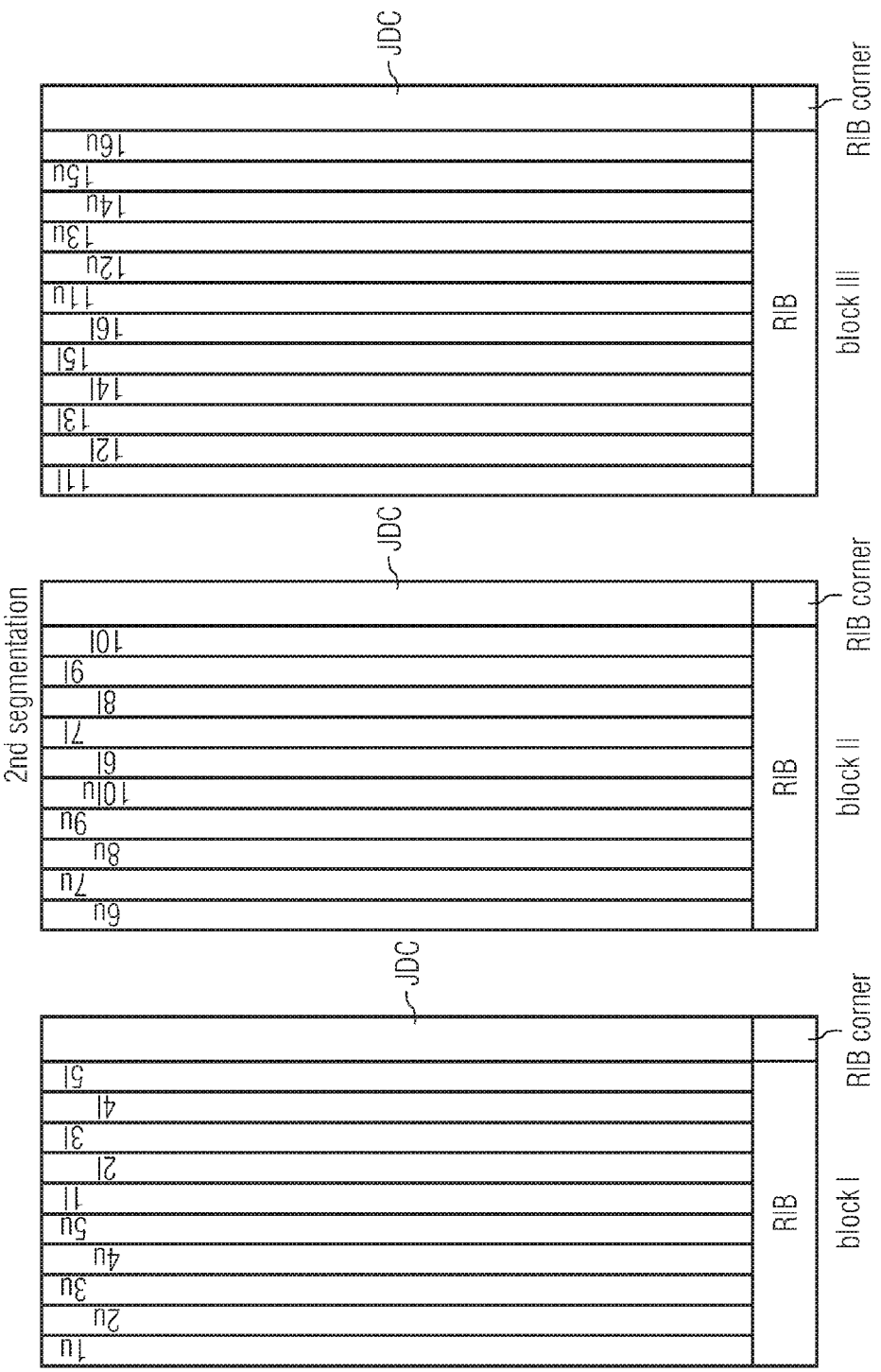

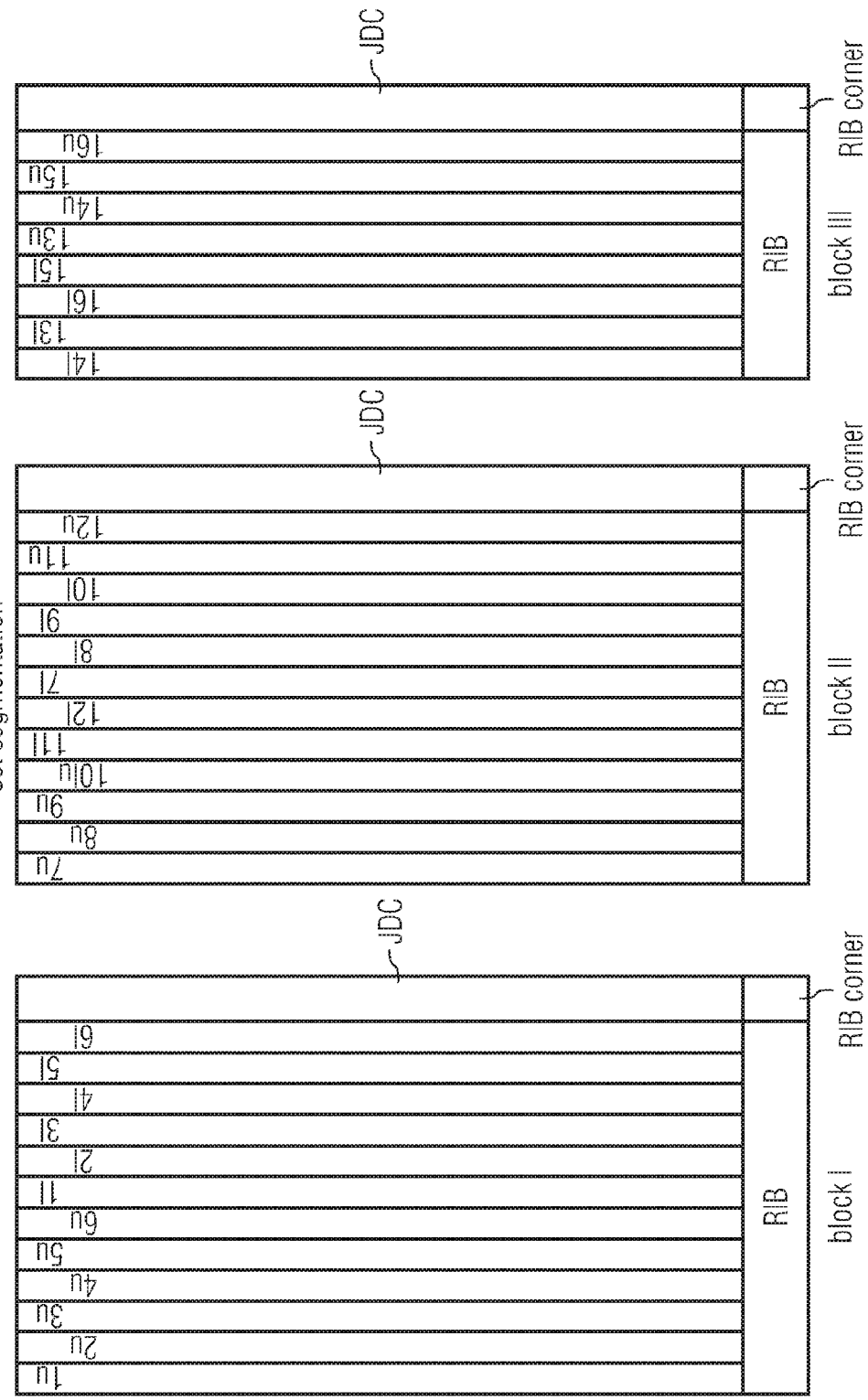

FIG 14

| A14 A13 A12 A11 A10 A9 | array block | Bank Selected | Bank Selected | Bank Selected | A14 A13 A12 A11 A10 A9 | array block | Bank Selected | Bank Selected | Bank Selected |
|---|---|---|---|---|---|---|---|---|---|
| 0 0 0 0 0 0 | 1L | BANK<i/0/0> | BANK<i/0/0> | BANK<i/0/0> | 0 0 0 0 0 0 | 1L | BANK<i/1/0> | BANK<i/1/0> | BANK<i/1/0> |
| 0 0 0 0 0 1 | 2L | BANK<i/0/0> | BANK<i/0/0> | BANK<i/0/0> | 0 0 0 0 0 1 | 2L | BANK<i/1/0> | BANK<i/1/0> | BANK<i/1/0> |
| 0 0 0 0 1 0 | 3L | BANK<i/0/0> | BANK<i/0/0> | BANK<i/0/0> | 0 0 0 0 1 0 | 3L | BANK<i/1/0> | BANK<i/1/0> | BANK<i/1/0> |
| 0 0 0 0 1 1 | 4L | BANK<i/0/0> | BANK<i/0/0> | BANK<i/0/0> | 0 0 0 0 1 1 | 4L | BANK<i/1/0> | BANK<i/1/0> | BANK<i/1/0> |
| 0 0 0 1 0 0 | 5L | BANK<i/0/1> | BANK<i/0/0> | BANK<i/0/0> | 0 0 0 1 0 0 | 5L | BANK<i/1/1> | BANK<i/1/0> | BANK<i/1/0> |
| 0 0 0 1 0 1 | 6L | BANK<i/0/1> | BANK<i/0/0> | BANK<i/0/0> | 0 0 0 1 0 1 | 6L | BANK<i/1/1> | BANK<i/1/0> | BANK<i/1/0> |
| 0 0 0 1 1 0 | 7L | BANK<i/0/1> | BANK<i/0/1> | BANK<i/0/1> | 0 0 0 1 1 0 | 7L | BANK<i/1/1> | BANK<i/1/1> | BANK<i/1/1> |
| 0 0 0 1 1 1 | 8L | BANK<i/0/1> | BANK<i/0/1> | BANK<i/0/1> | 0 0 0 1 1 1 | 8L | BANK<i/1/1> | BANK<i/1/1> | BANK<i/1/1> |
| 0 0 1 0 0 0 | 9L | BANK<i/0/2> | BANK<i/0/1> | BANK<i/0/1> | 0 0 1 0 0 0 | 9L | BANK<i/1/2> | BANK<i/1/1> | BANK<i/1/1> |
| 0 0 1 0 0 1 | 10L | BANK<i/0/2> | BANK<i/0/1> | BANK<i/0/1> | 0 0 1 0 0 1 | 10L | BANK<i/1/2> | BANK<i/1/1> | BANK<i/1/1> |
| 0 0 1 0 1 0 | 11L | BANK<i/0/2> | BANK<i/0/2> | BANK<i/0/1> | 0 0 1 0 1 0 | 11L | BANK<i/1/2> | BANK<i/1/2> | BANK<i/1/1> |
| 0 0 1 0 1 1 | 12L | BANK<i/0/2> | BANK<i/0/2> | BANK<i/0/1> | 0 0 1 0 1 1 | 12L | BANK<i/1/2> | BANK<i/1/2> | BANK<i/1/1> |
| 0 0 1 1 0 0 | 13L | BANK<i/0/2> | BANK<i/0/2> | BANK<i/0/2> | 0 0 1 1 0 0 | 13L | BANK<i/1/2> | BANK<i/1/2> | BANK<i/1/2> |
| 0 0 1 1 0 1 | 14L | BANK<i/0/2> | BANK<i/0/2> | BANK<i/0/2> | 0 0 1 1 0 1 | 14L | BANK<i/1/2> | BANK<i/1/2> | BANK<i/1/2> |
| 0 0 1 1 1 0 | 15L | BANK<i/0/2> | BANK<i/0/2> | BANK<i/0/2> | 0 0 1 1 1 0 | 15L | BANK<i/1/2> | BANK<i/1/2> | BANK<i/1/2> |
| 0 0 1 1 1 1 | 16L | BANK<i/0/2> | BANK<i/0/2> | BANK<i/0/2> | 0 0 1 1 1 1 | 16L | BANK<i/1/2> | BANK<i/1/2> | BANK<i/1/2> |
| 0 1 0 0 0 0 | 1U | BANK<i/0/0> | BANK<i/0/0> | BANK<i/0/0> | 0 1 0 0 0 0 | 1U | BANK<i/1/0> | BANK<i/1/0> | BANK<i/1/0> |
| 0 1 0 0 0 1 | 2U | BANK<i/0/0> | BANK<i/0/0> | BANK<i/0/0> | 0 1 0 0 0 1 | 2U | BANK<i/1/0> | BANK<i/1/0> | BANK<i/1/0> |
| 0 1 0 0 1 0 | 3U | BANK<i/0/0> | BANK<i/0/0> | BANK<i/0/0> | 0 1 0 0 1 0 | 3U | BANK<i/1/0> | BANK<i/1/0> | BANK<i/1/0> |
| 0 1 0 0 1 1 | 4U | BANK<i/0/0> | BANK<i/0/0> | BANK<i/0/0> | 0 1 0 0 1 1 | 4U | BANK<i/1/0> | BANK<i/1/0> | BANK<i/1/0> |
| 0 1 0 1 0 0 | 5U | BANK<i/0/1> | BANK<i/0/0> | BANK<i/0/0> | 0 1 0 1 0 0 | 5U | BANK<i/1/1> | BANK<i/1/0> | BANK<i/1/0> |
| 0 1 0 1 0 1 | 6U | BANK<i/0/1> | BANK<i/0/0> | BANK<i/0/0> | 0 1 0 1 0 1 | 6U | BANK<i/1/1> | BANK<i/1/0> | BANK<i/1/0> |
| 0 1 0 1 1 0 | 7U | BANK<i/0/1> | BANK<i/0/1> | BANK<i/0/1> | 0 1 0 1 1 0 | 7U | BANK<i/1/1> | BANK<i/1/1> | BANK<i/1/1> |
| 0 1 0 1 1 1 | 8U | BANK<i/0/1> | BANK<i/0/1> | BANK<i/0/1> | 0 1 0 1 1 1 | 8U | BANK<i/1/1> | BANK<i/1/1> | BANK<i/1/1> |
| 0 1 1 0 0 0 | 9U | BANK<i/0/2> | BANK<i/0/1> | BANK<i/0/1> | 0 1 1 0 0 0 | 9U | BANK<i/1/2> | BANK<i/1/1> | BANK<i/1/1> |
| 0 1 1 0 0 1 | 10U | BANK<i/0/2> | BANK<i/0/1> | BANK<i/0/1> | 0 1 1 0 0 1 | 10U | BANK<i/1/2> | BANK<i/1/1> | BANK<i/1/1> |
| 0 1 1 0 1 0 | 11U | BANK<i/0/2> | BANK<i/0/2> | BANK<i/0/1> | 0 1 1 0 1 0 | 11U | BANK<i/1/2> | BANK<i/1/2> | BANK<i/1/1> |
| 0 1 1 0 1 1 | 12U | BANK<i/0/2> | BANK<i/0/2> | BANK<i/0/1> | 0 1 1 0 1 1 | 12U | BANK<i/1/2> | BANK<i/1/2> | BANK<i/1/1> |
| 0 1 1 1 0 0 | 13U | BANK<i/0/2> | BANK<i/0/2> | BANK<i/0/2> | 0 1 1 1 0 0 | 13U | BANK<i/1/2> | BANK<i/1/2> | BANK<i/1/2> |
| 0 1 1 1 0 1 | 14U | BANK<i/0/2> | BANK<i/0/2> | BANK<i/0/2> | 0 1 1 1 0 1 | 14U | BANK<i/1/2> | BANK<i/1/2> | BANK<i/1/2> |
| 0 1 1 1 1 0 | 15U | BANK<i/0/2> | BANK<i/0/2> | BANK<i/0/2> | 0 1 1 1 1 0 | 15U | BANK<i/1/2> | BANK<i/1/2> | BANK<i/1/2> |
| 0 1 1 1 1 1 | 16U | BANK<i/0/2> | BANK<i/0/2> | BANK<i/0/2> | 0 1 1 1 1 1 | 16U | BANK<i/1/2> | BANK<i/1/2> | BANK<i/1/2> |
|  |  | 1st segmentation | 2nd segmentation | 3rd segmentation |  |  | 1st segmentation | 2nd segmentation | 3rd segmentation |

INTEGRATED CIRCUIT INCLUDING A MEMORY MODULE HAVING A PLURALITY OF MEMORY BANKS

BACKGROUND

The invention relates to a memory module which contains a plurality of memory banks having a respective multiplicity of memory cells.

Major topics with respect to the architecture of the memory module are the power network layout, pad disposition, data and control bus layout and packaging.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 7 illustrates a first layout structure of a memory module.

FIG. 8 illustrates a second layout structure of a memory module.

FIG. 9 illustrates a third layout structure of a memory module.

FIG. 12 illustrates a schematic view of a 2nd re-organization of the half memory bank of FIG. 10.

FIG. 13 illustrates a schematic view of a 3rd re-organization of the half memory bank of FIG. 10.

FIG. 14 illustrates a truth table to address the 1st re-organization, the 2nd re-organization and the 3rd re-organization of the half memory bank of FIG. 10.

DETAILED DESCRIPTION

Figure 1:
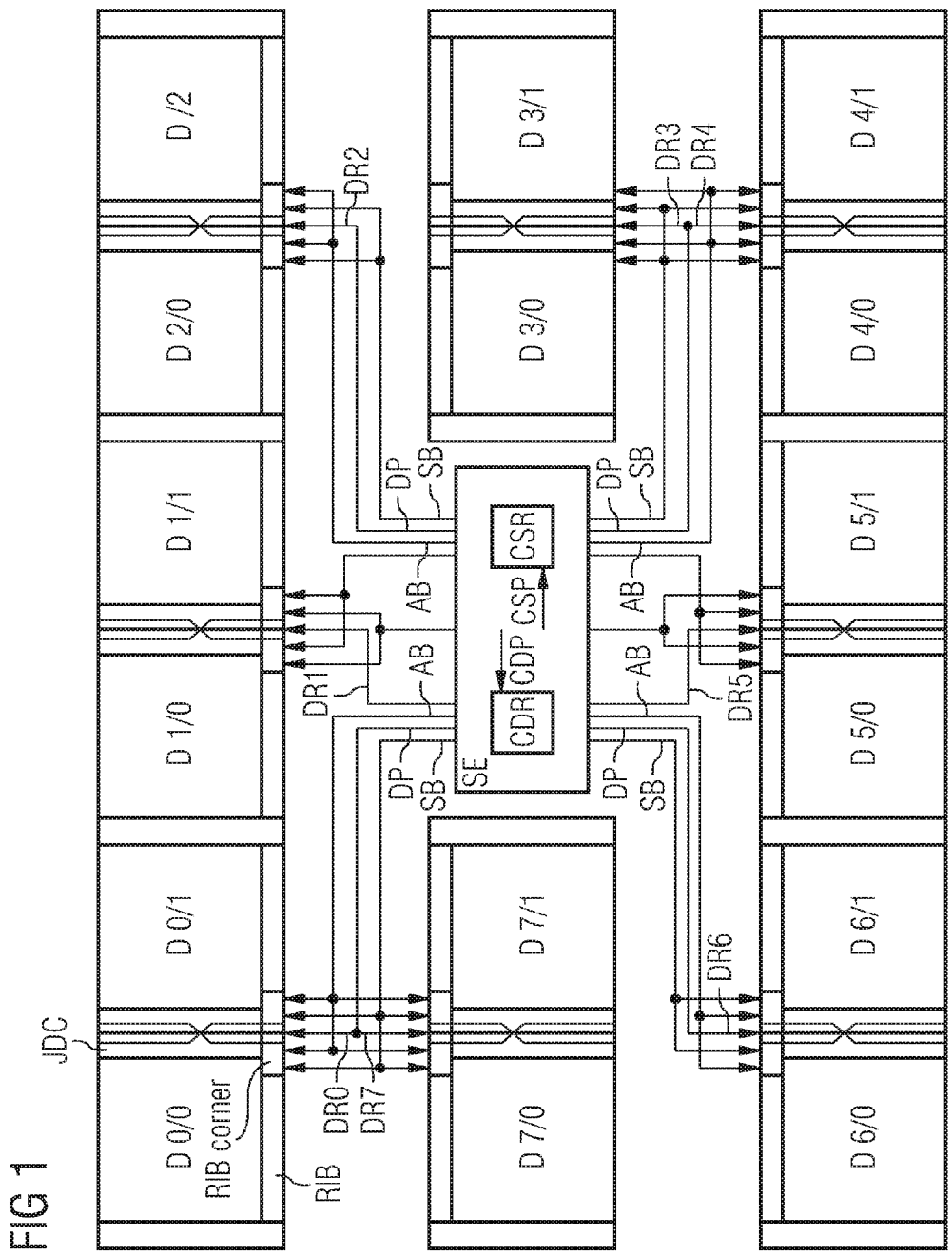
FIG. 1 illustrates a schematic view of an integrated circuit including a memory module with a donut-architecture.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

A memory module contains a plurality of memory banks having a respective multiplicity of memory cells. A preferred but not exclusive area of application is a memory module containing dynamic RAM (known as "DRAM") chips as memory banks. The acronym RAM is known to refer to a read/write memory with direct and random access to the memory cells (Random Access Memory). Memory modules having DRAM chips are customary as main memories in computers and other electronic devices.

The memory cells in a memory bank, in one embodiment in a DRAM chip which is subsequently also referred to as a "DRAM" for short, are usually arranged in matrix form in rows and columns. Selective access to a memory cell for the purpose of writing or reading a data bit is effected by activating a word line associated with the relevant row on the basis of a row address and connecting a bit line associated with the relevant column to a bi-directional data port on the memory bank. This connection is set up using a data line network containing amplifiers and switches which can be selectively activated on the basis of a column address.

Memory banks are normally in a form such that each access clock cycle involves not just a single memory cell but rather a group of m memory cells being selected simultaneously, in order to write or read m data bits simultaneously in parallel. To this end, the addresses and the data line network are designed such that in response to a column address m bit lines determined by row addresses are simultaneously connected to m data connections on the data port of the memory bank via the data line network.

The number m of selected memory cells and hence the bit width of the data passing through the data port, may be a power of 2; m-values of 4, 8 and 16 are currently usual. Memory banks are configured during manufacture such that the m-value can be selected or set in order to operate the RAM optionally in a 4-bit mode, a 8-bit mode or a 16-bit mode.

To produce a data storage with a large storage capacity and/or with a high data throughput, a plurality k of memory banks are combined, memory banks being of the same bit width m. The plurality k of memory banks are grouped together to form a memory module on a board. The k memory banks are simultaneously accessed in parallel mode in order to write or read k data packets, each of which includes m data bits, during each access operation. To this end, the memory module has a central data port for n=m*k parallel bits and a central n-bit data register (the symbol * represents a multiplication sign here and below). The central data register serves as a data buffer between the central data port and the data ports of the k memory banks, which are connected to a central data register via a respective associated m-bit data bus.

Further, control signals are delivered via a central control signal port of the memory module to a central control signal register. These control signals include all the necessary signals for command and time-control for the operating cycles within the k memory banks and also selection signals for addressing memory cells.

An example of a layout of a memory module is a donut-architecture. The donut-architecture means a memory module layout in which the memory banks surround a spine which includes a central transmission/reception block with the central data port, the central data register, the central control signal port and the central control signal register.

A further example of a layout of a memory module is a dual inline memory module (DIMM), the memory bank of the DIMM being arranged symmetrically with respect to the central transmission/reception block. This means that two memory banks are always at the same distance away from the transmission/reception block.

The memory module typically includes an even number of memory banks, each memory bank having of the same memory capability. To reduce power consumption and to optimize memory module layout, each memory bank is further divided in two halves. This leads to an effective memory module structure having a doubled number of memory banks, wherein the two half memory banks share the same data port, which is connected to the central data register via the respective associated m-bit data bus. Each of the half memory banks can be selected independently for memory access. However, due to the common data ports of each pair of half memory banks, only one half of the half memory banks can be accessed in parallel. This means that either one half memory bank of each pair of half memory banks can be selected but not both at the same time.

Major topics with respect to the architecture of the memory module are the power network layout, pad disposition, data and control bus layout and packaging. This also applies to memory modules using pairs of half memory bank architecture to improve the performance of the memory module.

The power distribution is very critical due to the large spacing between power input pads located in the spine of the memory module and the memory banks. Furthermore the packaging of the memory banks on the memory module requires a single row address bus in order to engineer double-side modules having memory banks on both sides of the memory board and/or a stack fold memory system having a plurality of memory modules. The single row address bus results in a restriction of the number of bus lines. The limitation leads to the fact that it is difficult to implement the 16-bit mode in a memory module having a donut architecture.

However, not only the limitation caused by the single row address bus is a blocking point for the implementation of 16-bit mode in a donut architecture but also congested regions on the memory module anticipate the use of the 16-m bit organization in the memory module. The operation of the memory module in the 16-bit mode is essential to enable a testing operation at a tolerable speed.

Furthermore the data bus lines as well as the control signal bus lines on the memory module are very long and asymmetrical. Therefore, additional drivers are necessary in order to propagate the data bits from the memory banks to the central data register. This also applies to the control signal bus lines between the central control signal register and the memory banks which require additional drivers along their paths. Moreover, in order to save power during memory module access operations, the control signals must be gated so that an unnecessary toggling resulting from the long control signal bus lines can be avoided. The gating operation of the control signals leads to a decreasing memory module performance. Above all the memory module architecture in, one embodiment the donut architecture, is area consuming. This results from the fact that large parts of the spine are not used caused by an unfavourable spine layout.

Embodiments are illustrated using the example of a memory module having a donut-architecture. However, embodiments can, in principle, be used for all types of memory module layouts. The invention is also not limited to memory modules having DRAMs as memory banks, but rather can be used for memory modules having all types of memory banks such as SRAMs, flash memory cells and others.

A 2 Gbit memory module with the donut-architecture is illustrated in FIG. 1. However, the invention is not limited to memory modules having such a storage capacity. The 2 Gbit memory module includes k=8 memory banks D[0:7] of 256 Mbit storage capacity. The k=8 memory banks D[0:7] surround a spine which includes a central transmission/reception block SE with a central data register CDR, a central bi-directional data port CDP, a central control signal register CSR and a central control signal port CSP.

Each memory bank D[i] is further divided in two halves D[i/0, i/1], each half memory bank D[0/0:7/1] being of 128 Mbit storage capacity. This leads to an effective memory module structure with 16 half memory banks D[0/0:7/1], wherein each pair of two half memory banks shares the same bi-directional data port DP[0:7]. Each of the half memory banks can be selected independently for memory access. However, due to the common data ports of each pair of half memory banks, only half of the half memory banks can be accessed in parallel. This means that either one half memory bank of each pair of half memory banks can be selected but not both at the same time.

The data are transmitted in the 2 Gbit memory module as 64-bit data packet between the central data port CDP of the memory module and the memory banks D[0:7] via the central data register CDR. The data ports DP[0:7] of the memory banks D[0:7] are respectively connected to the central data register CDR in parallel via a respective associated instance of 8 data buses DB[0:7], each data bus having 64 data lines providing a bit width of 64 bits.

Further, control signals are delivered to the central input register CSR of the memory module via the central control signal port CSP. These control signals include command signals for command and time-control of the operating cycles within the memory banks and also selection signals for addressing the memory cell in the memory banks D[0:7]. According to FIG. 1 each half memory bank D[0/0:7/1] is connected to the central transmission/reception block SE via a command signal bus SB[0/0:7/0] and an address bus AB[0/0:7:1]. Instead of using separated command signal buses SB[0/0:7/1] and address buses AB[0/0:7/1] for each half memory bank[0/0:7/1] some or all buses may be merged.

Each half memory bank D[0/0:7/1] has a interface RIB corner to the corresponding address bus AB[0/0:7:1] and the corresponding command signal bus SB[0/0:7/1]. The RIB corner contains an address decoding circuit, latches and re-drivers. Each half memory bank D[0/0:7/1] further includes a row path region so called RIB region including a row decoder and an column path region so called JDC region including a column decoder and a data in/out connection to the bi-directional data port DP[0:7] of the corresponding memory bank.

Figure 2:
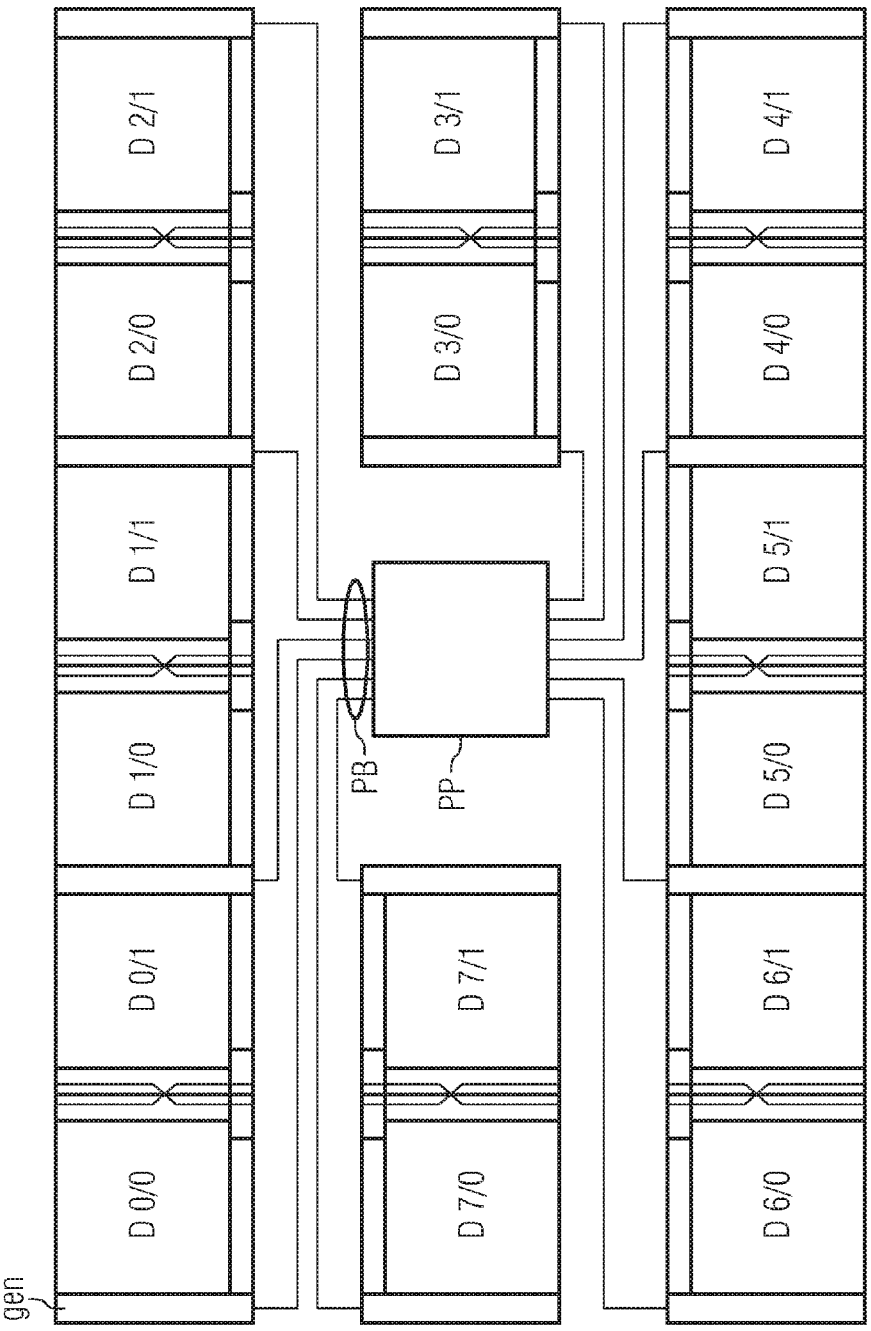
FIG. 2 illustrates a power distribution network of the memory module of FIG. 1.

FIG. 2 illustrates a power distribution network on the memory module of FIG. 1. A power path region so called gen region of each half memory bank D[0/0:7/1] is connected via a respective power bus PB[0/0:7/1] to at least a power pad PP located in the spine of the memory module. The power pad PP is suitable for connection to an external voltage supply.

The memory cells in each half memory bank D[0/0:7/1] are arranged in matrix form having rows and columns. The 128 Mbit half memory bank includes $2^{27}$ memory cells located at the intersection of $2^{14}$(16K) word lines and $2^{11}$(2K) bit lines. Each memory cell includes a storage capacitor and a selection transistor. In the case of a read or write process, the storage capacitor of the memory cell is charged or discharged, respectively, with an electrical charge which corresponds to a data bit via the selection transistor.

Figure 3:
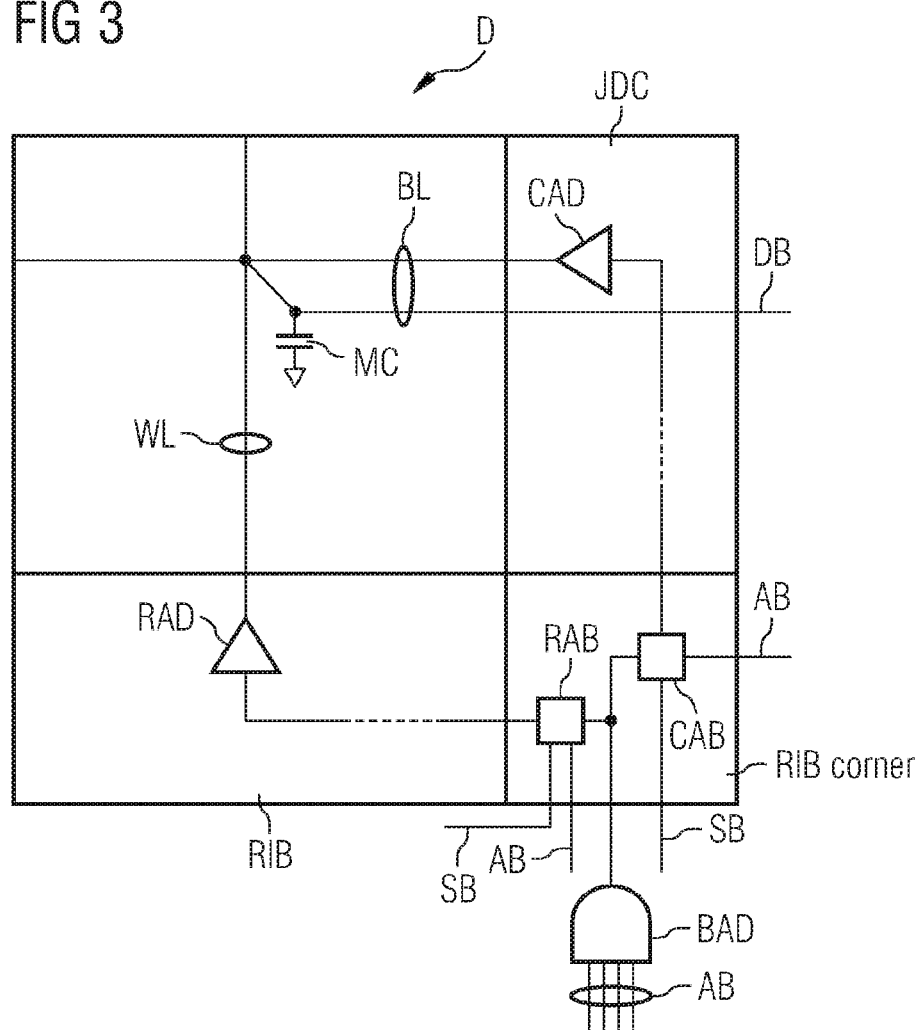
FIG. 3 illustrates a schematic view of a half memory bank of the memory module of FIG. 1.

FIG. 3 illustrates a half memory bank of the memory module of FIG. 1 wherein for clarity reasons only one memory cell MC located at an intersection of a word line WL and a bit line BL is drawn in. Selective access to a memory cell for the purpose of writing or reading a data bit is effected by activating the word line WL associated with the relevant row and connecting the bit line BL associated with the relevant column to the bi-directional data port DP of the memory bank.

In order to address a desired memory cell in the 16 half memory banks D[0/0:7/1], the address decoding circuit is provided in the RIB corner of each half memory bank. The address decoding circuit as illustrated in FIG. 3 includes a bank address decoder BAD. 4 bank address bits BA[0:3] for selecting between 16 half memory banks are applied to the bank address decoder BAD via the corresponding address bus AB. By decoding these bank address bits the bank address decoder BAD ascertains the half memory bank in which the addressed memory cell is situated and activates a corresponding row address buffer RAB of the address decoding circuit via a bank activation signal so called banksel to latch a row address RA applied via the address bus AB to the RIB corner.

The specific bank select signal activating each half memory bank may be a "logical AND" between 3 bank address bits BA[0:2] and a row address bit RA[13]. This procedural method enables to address 16 half memory banks with three bit information from the bank addresses and one row address bit without losing time.

When a row activation signal RAS is applied to the half memory bank via the corresponding control signal bus SB the row address buffer RAB drives the latched row address to an associated row address decoder RAD in the RIB region of the half memory bank. The row address decoder RAD ascertains the addressed row in the memory cell array of the half memory bank that responds via the corresponding word line WL. 14 row address bits RA[0:13] for selecting between $2^{14}$ row addresses within a half memory bank are used.

Next, a column activation signal CAS is applied to the RIB corner of the half memory bank via the control signal bus SB. Since only 8 half memory banks of the 16 half memory banks D[0/0:7/1] can be selected at the same time there are 8 different column activation signals CAS. The column activation signal CAS activates a column address buffer CAB of the address decoding unit to transfer a latched column address CA applied via the address bus AB to an associated column address decoder CAD in the JDC region of the half memory bank, which ascertains the sought column within the memory cell array that responds via the corresponding bit line BL. 11 column address bits CA[0:10] for selecting between $2^{11}$ column addresses within a half memory bank are used.

During a read access, the data bit stored in the addressed memory cell is outputted via the bit line BL, is then amplified by a sense amplifier (not illustrated) associated with the bit line BL and is transferred to the central data register CDR of the memory module via the related data bus DB. For write access, a write enable signal is additionally activated. The data bit to be written is transferred from the central data register CDR to the selected half memory bank via the related data bus DB. In the selected half memory bank the data bit is forwarded to the addressed memory cell via the associated bit line BL by the corresponding sense amplifier and is then stored in the addressed memory cell.

A memory access operation of the half memory bank, however, involves not just a single memory cell but rather a group of m memory cells being selected simultaneously, in order to write or read m data bits simultaneously in parallel. The number m of selected memory cells and hence the bit width of the data passing through the data port of the half memory bank is 4, 8 or 16. The half memory banks are configured during manufacture such that the m-value can be selected or set in order to operate the half memory banks optionally in a 4-bit mode, a 8-bit mode or a 16-bit mode.

The use of a memory module layout having a half memory bank architecture resulting in a 2 Gbit memory module with 16 128 Mbit half memory banks instead of 8 256 Mbit memory banks considerably improves the performance of the module, but a lot of issues remain unsolved.

The large spacing between power pad PD of the memory module and the respective half memory banks D[0/0:7/1] makes the power distribution complex in memory modules. In order to engineer double-side memory modules having half memory banks on both sides of the memory board and/or a stack fold memory system having a plurality of memory modules, a single address bus for all half memory banks applying the row addresses is preferred. A single row address bus however results in a restriction of the number of bus lines, which makes it difficult to operate the memory module in the 16-bit mode which is in one embodiment preferred for test operation.

Moreover in memory modules re-drivers are necessary in order to propagate the data signal from half memory banks D[0/0:7/1] to the central data register CDR via the data buses DB[0:7]. A memory module having a half memory bank architecture is very area consuming. This, in one embodiment, applies in case of the application of the donut architecture, in which more then ¾ of the spine area is unused.

To address at least one of these issues according to one embodiment the half memory banks of the memory module are classified into two groups, each including a memory bank of each memory bank region. The memory module further includes a selection device connected to the memory banks and being responsive to selection bits in order to select one of the two groups of memory banks and a group of i memory cells within the memory banks of the selected group of memory banks to access the selected i memory cells, i.e. to write or to read data of the selected i memory cells per one stroke via associated m-bit data buses of the memory groups including the selected memory banks, m being equal to an integer multiple of i.

According to another embodiment a memory module includes an even number of at least four memory banks, each memory bank having a plurality of memory cells, each two of the memory banks forming a memory bank region and being alternately connected to an 8-bit data bus. The memory banks are classified into two groups, each including a memory bank of each memory bank region. The memory module further includes a selection device connected to the memory banks and being operated in one of a 16-bit mode, a 8-bit mode and a 4-bit mode to access the memory bank regions, i.e. to write or to read data from a central data register to the memory bank regions.

In the 16-bit mode the selection device is responsive to selection bits in order to select one of the two groups of memory banks and per stroke a group of 16 memory cells within the memory banks of the selected group of memory banks to write or to read data of the selected memory cells via the associated 8-bit data buses of the memory regions including the selected memory banks In the 8-bit mode the selection device is responsive to selection bits in order to select one of the two groups of memory banks and per stroke a group of 8 memory cells within the memory banks of the selected group of memory banks to write or to read data of the selected memory cells via the associated 8-bit data buses of the memory regions including the selected memory banks.

Figure 4:
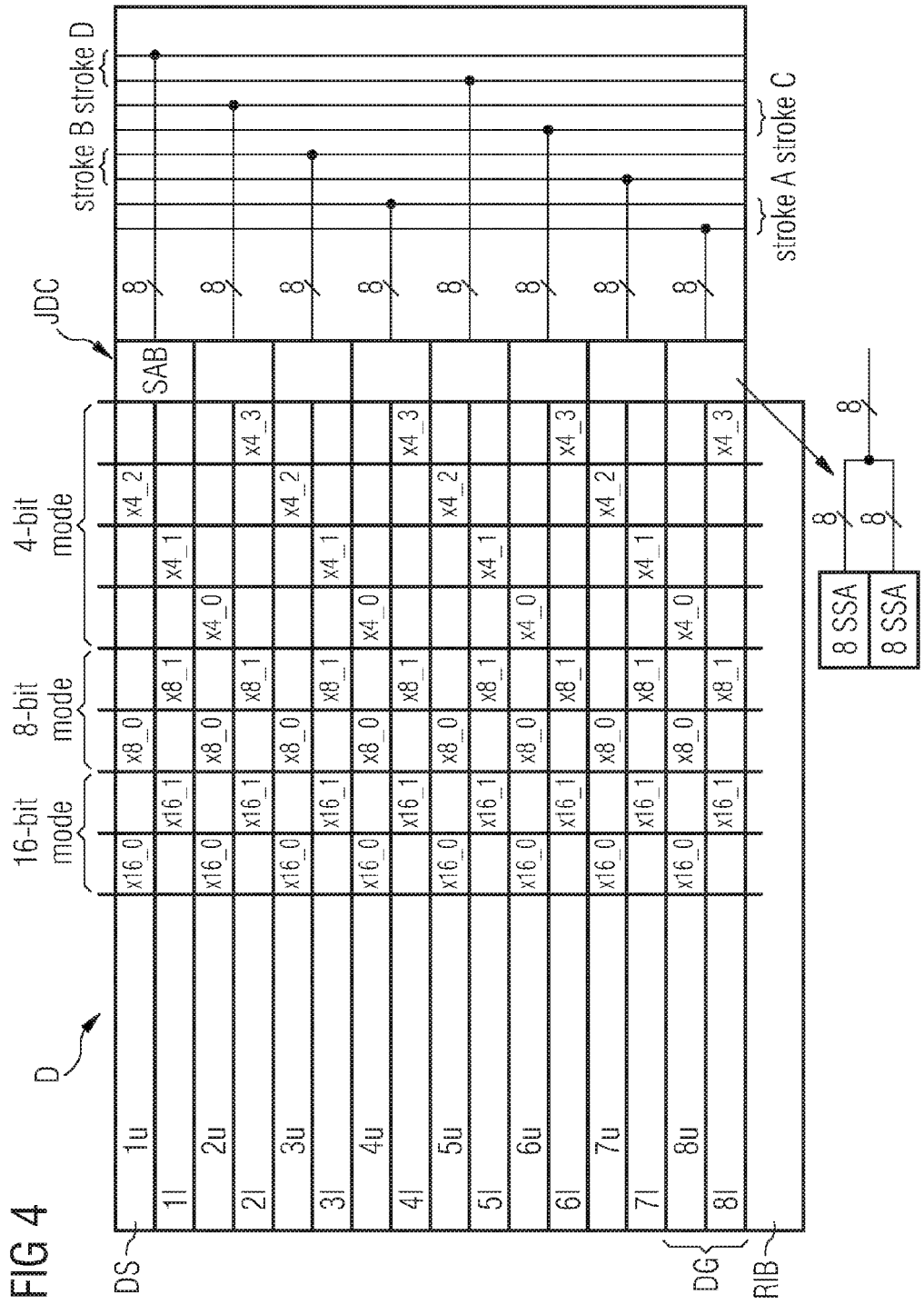
FIG. 4 illustrates a schematic view of a segmented half memory bank of the memory module of FIG. 1.

In the 4-bit mode the selection device is responsive to selection bits in order to select one of the two groups of memory banks and per stroke a group of 4 memory cells within the memory banks of the selected group of memory banks to write or to read data of the selected memory cells via the associated 8-bit data buses of the memory regions including the selected memory banks According to another embodiment a memory module includes a 128 Mbit memory bank connected to a m-bit data bus and including 32 4 Mbit memory sub banks. Each 4 Mbit memory sub bank has a plurality of memory cells, the memory cells being arranged in matrix form having 256 row lines and 4 column lines. The memory sub banks are classified into three groups of any of the following configurations: One group including 16 4 Mbit memory sub banks and two groups including 8 4 Mbit memory sub banks, one group including 12 4 Mbit memory sub banks and two groups including 10 4 Mbit memory sub banks and one group including 8 4 Mbit memory sub banks and two groups including 12 4 Mbit memory sub banks As illustrated in FIG. 4 according to one embodiment each 128 Mbit half memory bank D is divided into 16 memory bank segments DS[1u:8l]. Each memory bank segment DS[1u:8l] contains $2^{24}$ memory cells located at the intersection of $2^{14}$ (16 k) word lines and 128 bit lines selected from $2^8$ (256) bit lines of the 128 Mbit half memory bank. Each two adjacent memory bank segments DS[1u,1l:8u,8l] are connected to a sense amplifier block SAB[1:8] including 16 sense amplifiers SSA. 8 first sense amplifiers SSA of the 16 sense amplifiers SSA form a first sense amplifier group associated with one of the two memory bank segments. 8 second sense amplifiers SSA of the 16 sense amplifiers SSA form a second sense amplifier group associated with the other memory bank segment. Each sense amplifier group transfers at most 8 data bits to and from the corresponding memory bank segment. Those 8 data bits are to be transferred via an associated data bus having 8 data lines providing a bit width of 8 bits to the corresponding data port DP of the memory bank which is connected via the corresponding data bus DB[0:7] to the central data register CDR.

As illustrated in FIG. 4 each two memory bank segments DS[1u,1l:8u,8l] share a 8-bit data bus in the JDC region which is connected to the first and second 8 sense amplifier groups of the corresponding sense amplifier blocks SAB[1:8]. Those two memory bank segments DS[1u:8l] sharing a common 8-bit data bus form a memory bank group DG[1:8]. In consequence each 128 Mbit half memory bank contains 8 memory bank groups DG[1:8] formed by two memory bank segments DS having a common data bus. It is possible to repair a defect bit line in one memory bank segment of a memory bank group by using a bit line in the other memory bank segment of the memory bank group.

The 128 Mbit half memory bank illustrated in FIG. 4 is configured to operate in any of a 4-bit mode, a 8-bit mode and a 16-bit mode. In the 4-bit mode the 128 Mbit half bank memory simultaneously reads or writes 4 data bits in a so called stroke. In the 8-bit mode the 128 Mbit half bank memory accesses in parallel 8 data bits in a stroke. In the 16-bit mode the 128 Mbit half bank memory simultaneously reads or writes 16 data bits in a stroke. Since each data bank group DG[1:8] can provide at most 8 data bits at the same time in the 16-bit mode a stroke is divided into two half strokes. In case the memory module operates at a double data rate the data transfer of each stroke is carried out in a two-process operation within one operation cycle fetching four data bits in a first process and another four data bits in a second process.

The 128 Mbit half memory bank is divided in two word line sections a, b with respect to the word lines, each section including 64 of the 128 word lines. The two word line sections a, b are preferably selected via the row address bit RA[13] of the 14 row address bits RA[0:13] for selecting between $2^{14}$ row addresses within the half memory bank.

In the 16-bit mode all 8 memory bank groups DG[1:8] of the 128 Mbit half bank memory are activated. One memory bank segment of each memory bank group transfer 8-bit data per half stroke. As illustrated in FIG. 4, four strokes A, B, C, D are carried out in the 16-bit mode resulting in a bit width of 64 data bits. As further illustrated in FIG. 4 in the 16-bit mode only two combinations of the memory bank segments indicated by X16_0 and X16_1 are allowed. According to the first combination X16_0 the memory bank segments DS[1u:8u] operate in parallel to provide the four strokes A, B, C, D resulting in the 64-bit data word. According to the second combination X16_1 memory bank segments DS[1l:8l] operate parallel to provide the four strokes A, B, C, D resulting in the 64-bit data word.

Figure 5:
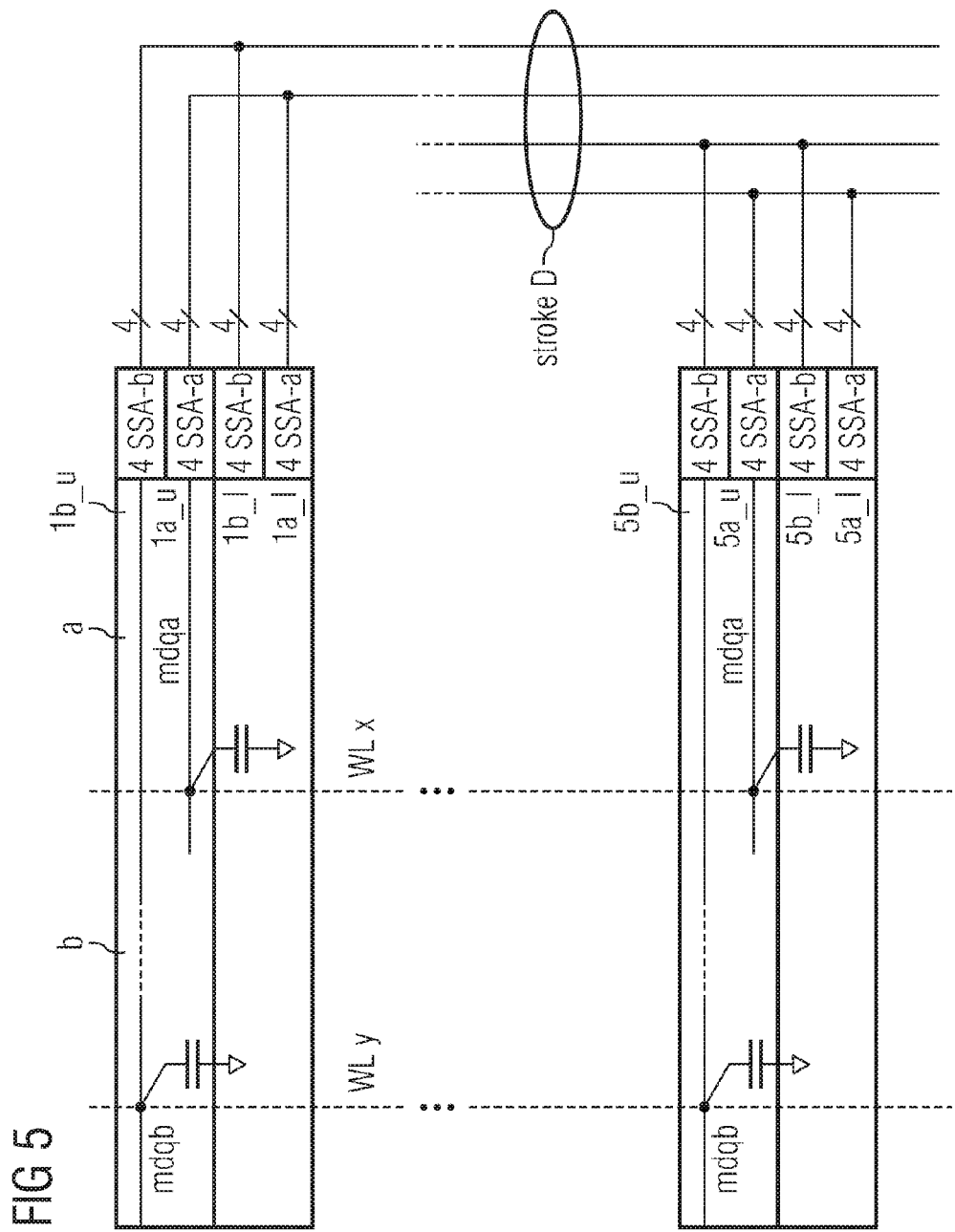
FIG. 5 illustrates a schematic view of a section of the half memory bank of FIG. 4 in detail.

FIG. 5 illustrates in greater detail the operation of the 128 Mbit half memory module D of FIG. 4 when performing stroke D of the four strokes A, B, C, D. In 16-bit mode at stroke D 8 data bits are provided either according to the first combination X16_0 by the two memory module segments DS [1u, 5u] of memory module groups DG [1, 5] or according to the second combination X16_1 by the two memory module segments DS [1l, 5l] of memory module groups DG [1, 5]. As further illustrated in FIG. 5 in the 16-bit mode two word lines WLx, WLy of the 128 Mbit half memory bank are activated. One word line WLx is located in the first word line section a of the 128 Mbit half memory bank and the other word line WLy is located in the second word line section b of the 128 Mbit half memory bank.

The 128 Mbit half memory bank operates at the double data rate wherein the data bits are fetched in the two process operation. A first group of 8 sense amplifiers SSA operates at the first half stroke of stroke D in the 16-bit mode in parallel. A second group of 8 sense amplifiers SSA operate at the second half stroke of stroke D in the 16-bit mode in parallel. Each 4 sense amplifiers SSA of the first and second group of 8 sense amplifiers SSA transfer data bits to and from memory cells of the first word line section a of the memory bank segments and the other each 4 sense amplifiers SSA of the first and second group of 8 sense amplifiers SSA transfer data bits to and from the memory cells of the second word line section b of the memory bank segments. In the 16-bit mode two scenarios occur in the 128 Mbit half memory bank at stroke D. In the first scenario memory cells of memory module segment groups 1b_u, 1a_u, 5b_u and 5a_u are selected. In the second scenario memory cells of memory module segment groups 1b_1, 1a_1, 5b_1, 5a_1 are selected.

In the 8-bit mode similar to the 16-bit mode one of the two memory bank segments of all the 8 memory bank groups DG[1:8] of the 128 Mbit half memory bank are activated. In contrast to the 16-bit mode, however, only one word line section either word line section, a or word line section b, is selected resulting in the fact that 8 sense amplifiers SSA operate in parallel per stroke. Therefore, in a four stroke operation, a bit width of 32 data bits is transferred between the 128 Mbit half memory bank and the central bank register CDR of the memory module. As illustrated in FIG. 4 two combinations of the memory bank segments within the memory bank groups indicated by X8_0 and X8_1 are allowed. According to the first combination X8_0 the memory bank segments DS[1u:8u] operate in parallel to provide the four strokes A, B, C, D resulting in the 32-bit data word. According to the second combination X8_1 memory bank segments DS[11:81] operate parallel to provide the four strokes A, B, C, D resulting in the 32-bit data word.

Since in the 8-bit mode only one word line section is selected preferably via the row address bit RA[13] either memory cells in the first word line section a of the half memory bank via word line WLx are activated or the second word line section b of the half memory bank via word line WLy are activated. As illustrated in FIG. 5 in the 8-bit mode at stroke D 4 data bits are provided either according to the first combination X8_0 by the memory module segments DS[1u, 5u] of memory module groups DG[1, 5] or according to the second combination X8_1 by the two memory module segments DS[11, 51] of memory module groups DG[1, 5]. In the 8-bit mode four scenarios occur in the 128 Mbit half memory bank at stroke D. In the first scenario memory cells of memory module segment groups 1b_u and 5b_u are selected. In the second scenario memory cells of memory module segment groups 1a_u and 5a_u are selected. In the third scenario memory cells of memory module segment groups 1b_1 and 5b_1 are selected. In the fourth scenario memory cells of memory module segment groups 1a_1 and 5a_1 are selected.

In the 4-bit mode only 4 memory bank groups DG of the 8 memory bank groups DG[1:8] of the 128 Mbit half memory bank are activated. Moreover, only one word line section, either word line section a or word line section b, is selected resulting in the fact that 4 sense amplifiers SSA operate in parallel per stroke. Therefore, in a four stroke operation a bit width of 16 data bits is transferred between the 128 Mbit half memory bank and the central bank register CDR of the memory module. As illustrated in FIG. 4 four combinations of the memory bank segments within the memory bank groups indicated by X4_0, X4_1, X4_2 and X4_3 are allowed. According to the first combination X4_0 the memory bank segments DS[2u,4u,6u,8u] operate in parallel to provide the four strokes A, B, C, D resulting in the 16-bit data word. According to the second combination X4_1 memory bank segments DS[11,31,51,71] operate in parallel to provide the four strokes A, B, C, D resulting in the 16-bit data word. According to the third combination X4_2 the memory bank segments DS[1u,3u,5u,7u] operate in parallel to provide the four strokes A, B, C, D resulting in the 16-bit data word. According to the fourth combination X4_3 memory bank segments DS[21,41,61,81] operate in parallel to provide the four strokes A, B, C, D resulting in the 16-bit data word.

In the 4-bit mode only one word line section is selected. Preferably via the row address bit RA[13], either memory cells in the first word line section a of the half memory bank via word line WLx are activated or the second word line section b of the half memory bank via word line WLy are activated. Therefore, in the 4-bit mode eight scenarios occur in the 128 Mbit half memory bank at stroke D as illustrated in FIG. 5. In the first scenario memory cells of memory module segment group 1b_u are selected. In the second scenario memory cells of memory module segment group 5b_u are selected. In the third scenario memory cells of memory module segment group 1a_u are selected. In the fourth scenario memory cells of memory module segment group 5a_u are selected. In the fifth scenario memory cells of memory module segment group 1b_1 are selected. In the sixth scenario memory cells of memory module segment group 5b_1 are selected. In the seventh scenario memory cells of memory module segment group 1a_1 are selected. In the eighth scenario memory cells of memory module segment group 5a_1 are selected.

Figure 6:
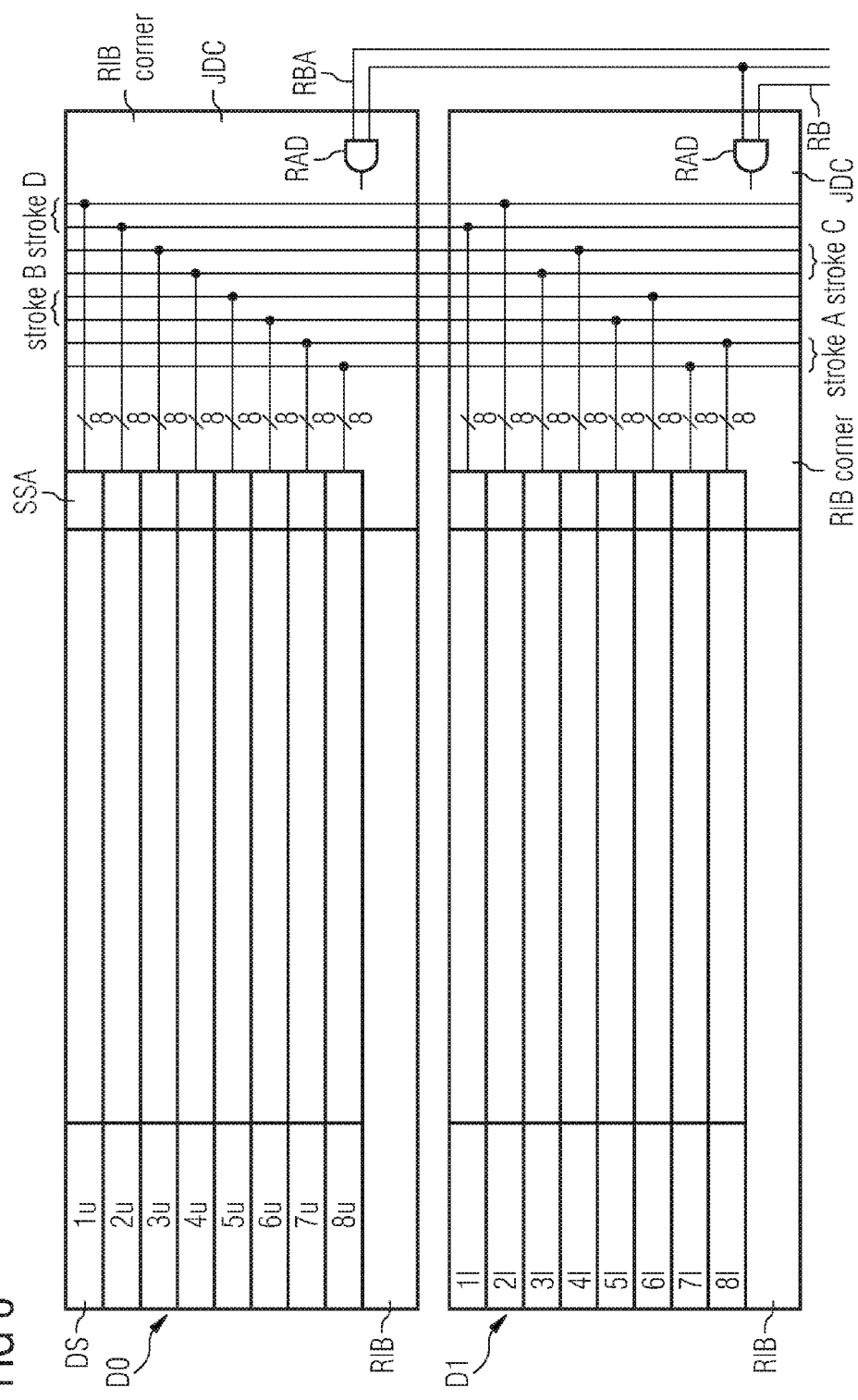
FIG. 6 illustrates a schematic view of a re-organization of the half memory bank of FIG. 4.

FIG. 6 illustrates a schematic view of a re-organization of the half memory bank D of FIG. 4. The 128 Mbit half memory bank D divided into 16 memory bank segments DS[1u:81] is classified into two memory bank regions D0, D1. Each memory bank region D0, D1 contains one of the two memory bank segments DS[1u,11:8u,81] of the 8 memory bank groups DG[1:8], the two memory bank segments DS[1u, 11:8u,81] of each memory bank group DG[1:8] sharing a common 8-bit data bus in the JDC region. Thus, the memory bank region D0 includes the memory bank segments DS[1u:8u] and the memory bank region D1 includes the memory bank segments DS[11:81]. In any of a 4-bit mode, a 8-bit mode and a 16-bit mode of the half memory bank D only one of the two memory bank regions D0, D1 is activated to read or write data bits.

Each memory bank region D0, D1 has an independent RIB corner containing an address decoding circuit, latches and re-drivers, an independent RIB region including a row decoder and an independent JDC region including a column decoder and a data in/out connection to the bi-directional data port of the corresponding memory bank. In order to address a desired memory bank region D0, D1 of the half memory bank, the address decoding circuit in the RIB corner includes a region address decoder RAD. A region address bit RBA for selecting between the two memory bank regions D0, D1 is applied to the region address decoder RAD. By decoding this region address bit the region address decoder RAD ascertains the memory bank region in which the addressed memory cells are situated and activates a corresponding column address buffer CAB of the address decoding circuit to transfer latched column addresses CA to an associated column address decoder CAD in the JDC region of the memory bank region. The row address bit RA[13], the column address bit RA[9] or the column address bit RA[11] may be used as the region address bit RBA for selecting between the two memory bank regions D0, D1 within the half memory bank.

Instead of locally analysing the row address bit RBA in each half memory bank region D0, D1 of the half memory bank D the half memory bank may include for example as part of the bank address decoder a selection device for selecting between the two memory bank regions D0, D1. In this case an activation signal is sent to the desired memory bank region. The additional selection operation to select one of the memory bank regions D0, D1 of a half memory bank D does not result in a speed loss since with selection operation can be carried out within a time frame of a standard memory access circle.

For an access operation in both memory bank regions D0, D1 of the half memory bank D a selected word line is activated by decoding the row address bits RA. By subdividing the half memory bank D into the two memory bank regions D0, D1 the word line length is halved resulting in a faster word line activation. Furthermore the partition of the half memory bank D into two memory bank regions D0, D1 makes it possible to activate only the JDC column of the selected memory bank region during a memory access operation in any of the 4-bit mode, the 8-bit mode or 16-bit mode reducing the overall current consumption of the memory module. Moreover by subdividing the half memory bank D into memory bank regions D0, D1 the arrangement of the half memory banks on the memory module can be optimized to reduce the length of the data bus lines and the address bus lines and to avoid an area consuming layout.

Figure 7:
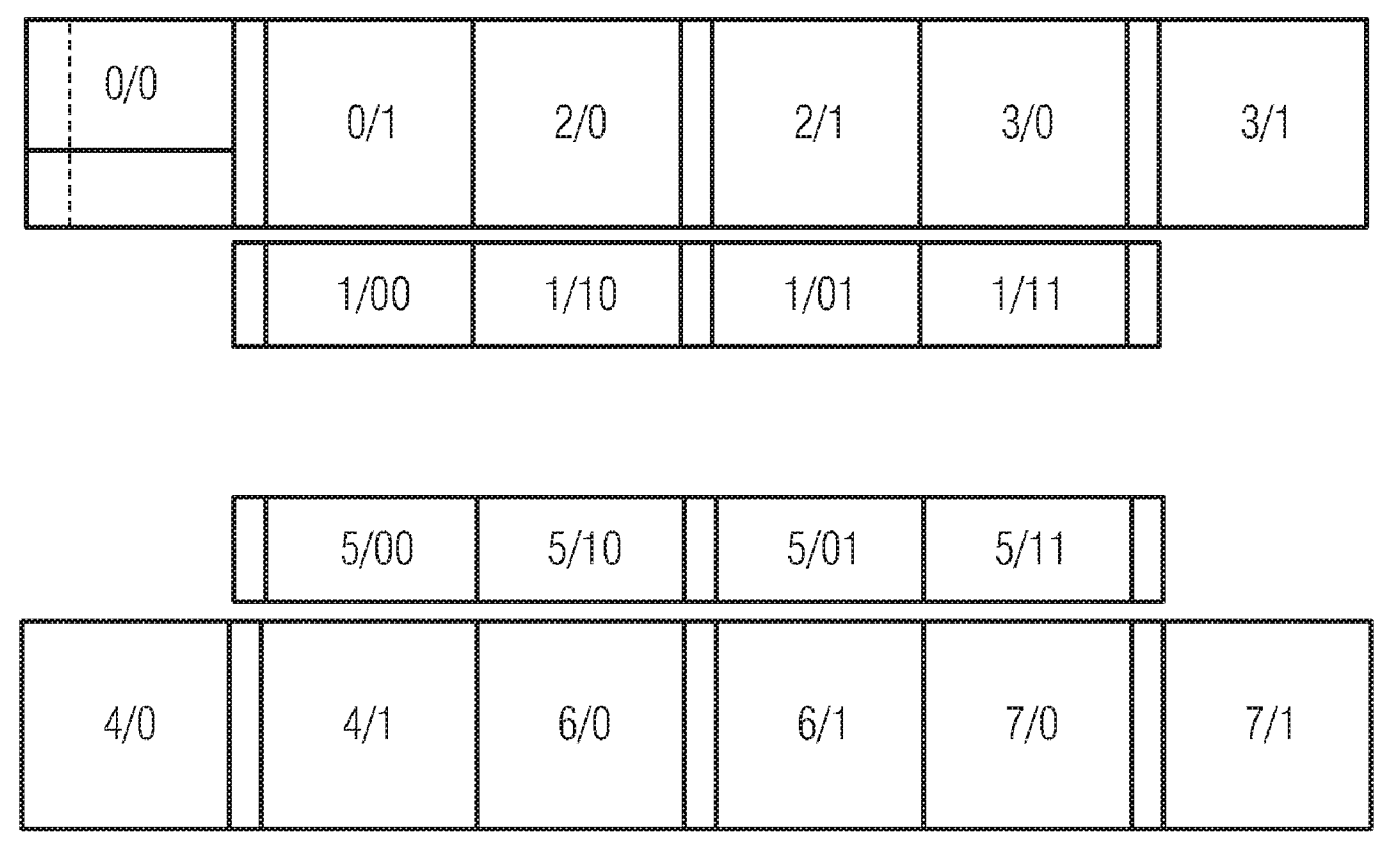

FIGS. 7 to 9 illustrate a first, a second and a third improved layout structure of a memory module based on the possibility of subdividing the half memory bank D[0/0:7/1]. In the first layout structure illustrated in FIG. 7 the 2 GBit memory module with the donut structure illustrated in FIG. 1 is reorganized in that the half memory banks are arranged in four rows. The first row includes 3 memory banks D[0, 2, 3] with 6 half memory banks D[0/0, 0/1, 2/0, 2/1, 3/0, 3/1]. The second row including one memory bank D[1] with two half memory banks D[1/0, 1/1]. Both half memory banks D[1/0, 1/1] are subdivided into two memory bank regions respectively so that 4 memory bank regions D[1/00, 1/10, 1/01, 1/11] are arranged side by side. In the third row opposite to the memory bank D[1] on the other side of the spine the memory bank D[5] is located having a structure similar to the structure of memory bank D[1]. The memory bank D[5] is subdivided into two half memory banks D[5/0, 5/1] having four memory bank regions D[5/00, 5/10, 5/01, 5/11]. In the fourth row symmetrical to the first row with respect to the spine three memory banks D[4, 6, 7] with 6 half memory banks D[4/0, 4/1, 6/0, 6/1, 7/0, 7/1] are disposed.

In the second layout structure of a memory module illustrated in FIG. 8 a similar layout as illustrated in FIG. 7 is used. However, the half memory bank regions of the memory bank D[1, 5] forming the second row and the third row being located on opposite sides of the spine are spaced apart from each other so that there is a gap between the memory bank region D[1/00] and the memory bank region D[1/10], the memory bank region[1/01] and the memory bank region[1/11], the memory bank region D[5/00] and the memory bank region D[5/10], the memory bank region[5/01] and the memory bank region[5/11], respectively.

FIG. 9 illustrates a third layout structure of a memory module, the memory banks being arranged similar to the layouts illustrated in FIGS. 8 and 9 having rows at both sides of the spine. The first row includes three memory banks D[0, 4, 6] with 6 half memory banks [D0/0, 0/1, 4/0, 4/1, 6/0, 6/1]. The second row and the third row include two memory banks D[2, 5] being subdivided in 4 half memory banks [D2/0, 2/1, 5/0, 5/1] with 8 memory bank regions [D2/00, 2/10, 2/01, 2/11, 5/00, 5/10, 5/01, 5/11], each two memory bank regions of the half memory bank facing each other in the second row and the third row, respectively. The fourth row includes memory banks D[1, 3, 7] with the half memory banks [D1/0, 1/1, 3/0, 3/1, 7/0, 7/1].

The layout structure illustrated in FIGS. 7 to 9 are only three possibilities for re-arranging the memory banks by subdividing the half memory banks of the memory banks into memory bank regions. The re-arrangement enables an optimized memory architecture by avoiding an unnecessary space consumption and an improved bus layout by reducing the bus line length. Moreover, the possibility of subdividing the half memory banks into further memory bank regions results in a faster operation and a reduced current consumption.

Figure 10:
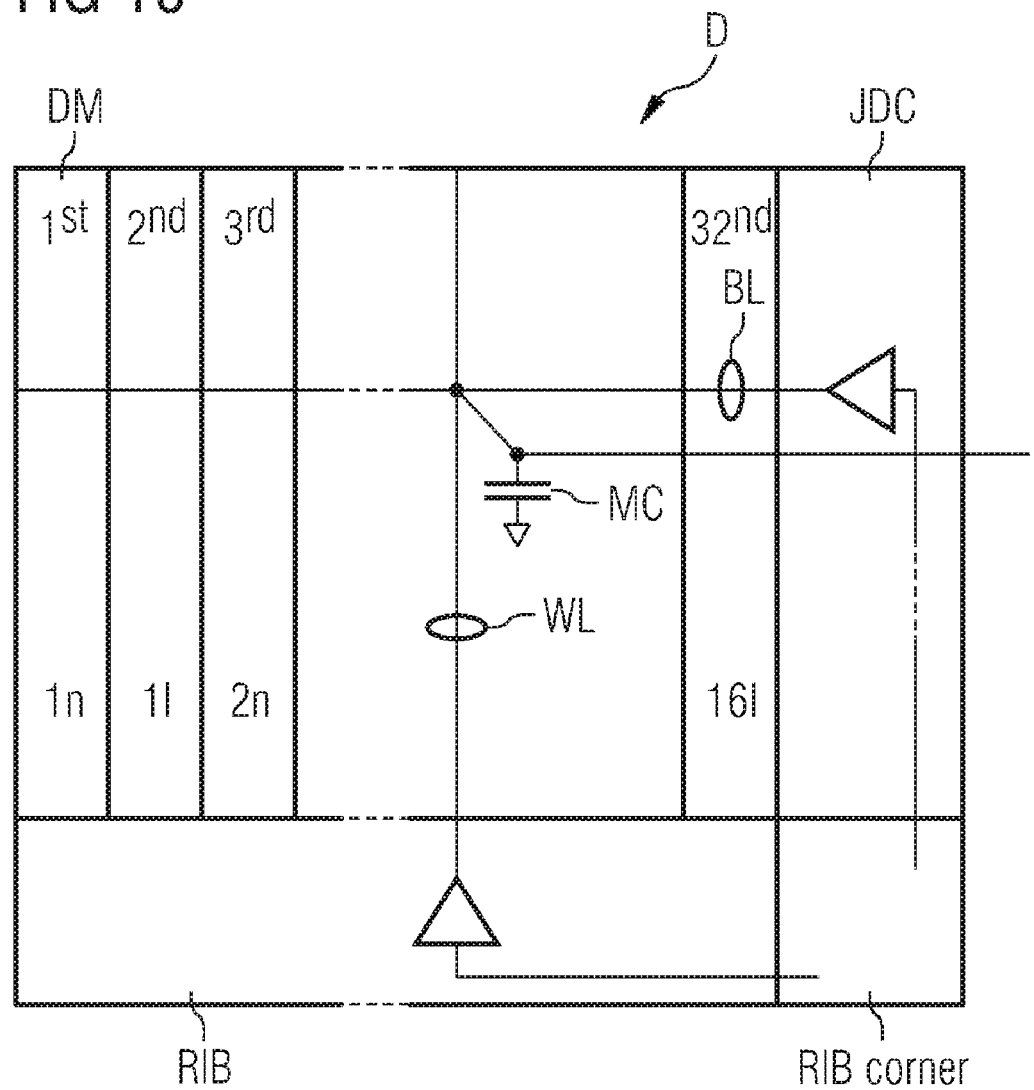
FIG. 10 illustrates a schematic view of a segmented half memory bank of the memory module of FIG. 1.

FIG. 10 illustrates a schematic view of 128 Mbit half memory bank D of the 2 Gbit memory module of FIG. 1, the 128 Mbit half memory bank D being segmented in 32 4 Mbit memory sub banks DM[1u,1l:16u,16l]. Each memory sub bank DM includes $2^{22}$ memory cells located at the intersections of $2^9$ (512) word lines and $2^{11}$ (2K) bit lines. For clarity reasons only one memory cell MC located at an intersection of a word line WL and a bit line BL is drawn into FIG. 10.

The 128 Mbit half memory bank can be set in order to operate in the 4-bit mode, the 8-bit mode or the 16-bit mode. In the 4-bit mode or the 8-bit mode one word line of the 128 Mbit half memory bank is activated to carry out a memory access operation. As illustrated in FIG. 5, for a memory access operation in the 4-bit mode or the 8-bit mode one 4 Mbit memory sub bank DM (including the selected word line) is operated. In consequence, in the 4-bit mode and in the 8-bit mode all the 32 4 Mbit memory sub banks DM[1u, 1l:16u, 16l] operate independently from each other. As further illustrated in FIG. 5 in the 16-bit mode two word lines of the 128 Mbit half memory bank are selected, one in the first word line section a, the other in the second word line section b. For a memory access operation in the 16-bit mode two 4 Mbit memory sub banks DM including the two selected word lines have to be operated in parallel. In consequence, in the 16-bit mode pairs of the 32 4 Mbit memory sub banks DM[1u, 1l:16u, 16l] are formed.

Figure 11:
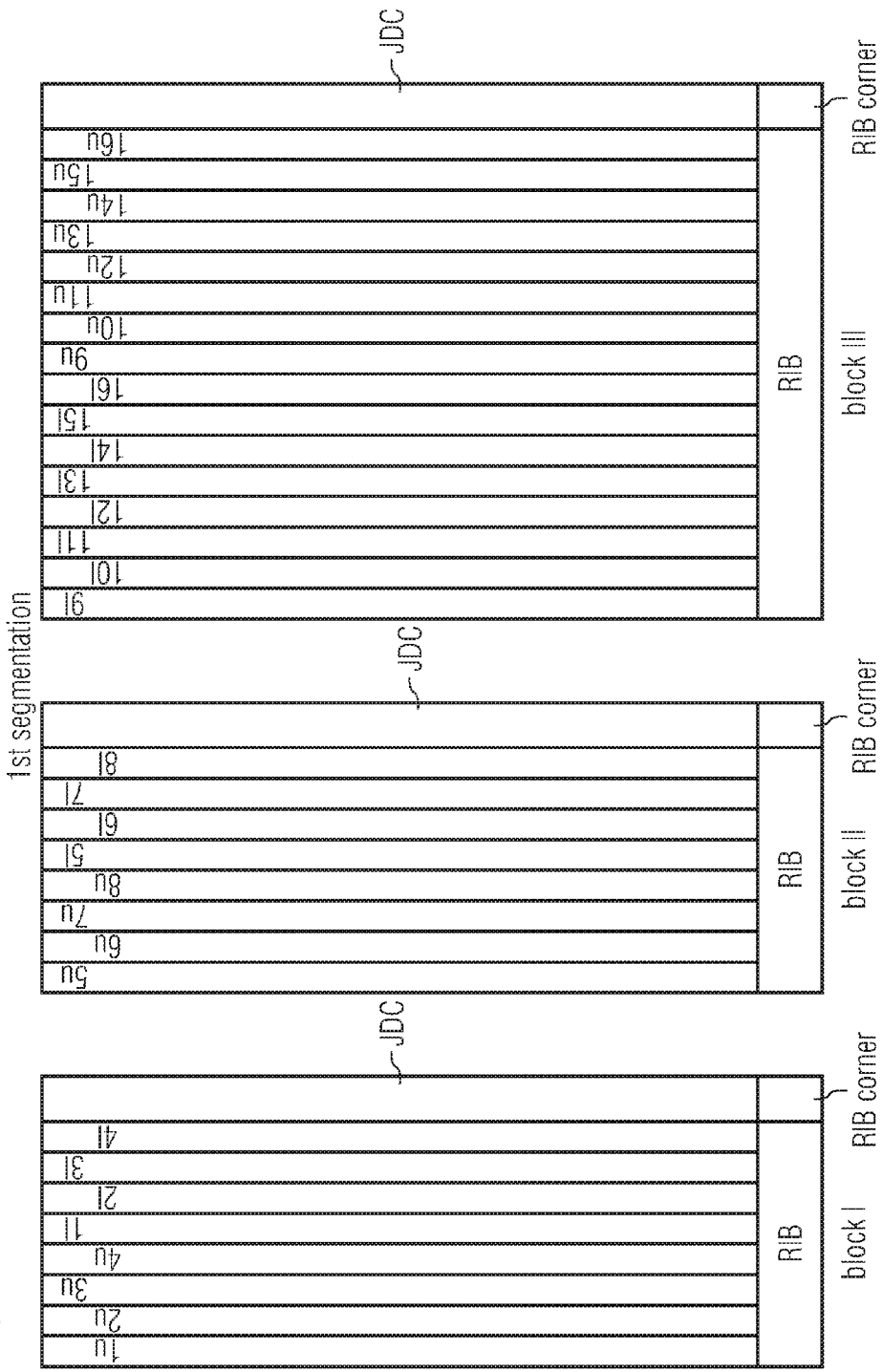
FIG. 11 illustrates a schematic view of a 1st re-organization of the half memory bank of FIG. 10.

To operate the 128 Mbit half memory bank D in any of the 4-bit mode, the 8-bit mode and the 16-bit mode the 32 4 Mbit memory sub banks DM[1u, 1l:16u, 16l] are classified into three groups block1, block2, block3 taking into account that in the 4-bit mode and in the 8-bit mode all the 32 4 Mbit memory sub banks DM[1u, 1l:16u, 16l] operate independently from each other and in the 16-bit mode pairs of the 32 4 Mbit memory sub banks DM[1u, 1l:16u, 16l] operate in parallel. FIG. 11 illustrates a schematic view of a first configuration, wherein group block 1 and group block 2 each includes 8 4 Mbit memory sub banks and group block 3 includes 16 4 Mbit memory sub banks. According to a second configuration illustrated in FIG. 12 group block 1 and group block 2 includes 10 4 Mbit memory sub banks and group block 3 includes 12 4 Mbit memory sub banks. According to a third configuration illustrated in FIG. 13 group block 1 and group block 2 each includes 12 4 Mbit memory sub banks and group block 3 includes 8 4 Mbit memory sub banks Each group block 1, block 2, block 3 of 4 Mbit memory sub banks DM[1u, 1l:16u, 16l] as illustrated in FIGS. 11 to 13 includes an independent RIP corner containing an address decoding circuit, latches and re-drivers and independent RIP region including a row decoder and an independent JDC region including a column decoder and a data in/output connection to the bi-directional data port of the corresponding memory bank. In any of a 4 bit mode, the 8 bit mode and the 16 bit mode only one of the three groups of memory sub banks illustrated in the configurations in FIGS. 11 to 13 is operated.

The selection of the memory sub bank group block 1, block 2, block 3 within a half memory banks D of the 16 half memory banks D[0/0:7/1] of the 2 Gbit memory module of FIG. 1 is preferable carried out by the bank address decoder. 4 bank address bits BA[0:3] for selecting between the 16 half memory banks D are applied to the bank address decoder via a corresponding address bus. By decoding these bank address bits the bank address decoder determines the half memory bank D to be operated for memory access. Preferable three bank address bits BA[0:2] and the row address bit RA[14] are used to address the 16 half memory banks D[0/0:7/1]. To select between the three groups block 1, block 2, block 3 of 4 Mbit memory sub banks within the selected half memory banks two additional address bits, preferable the row address bits RA[12, 13] are used.

Figure 15:
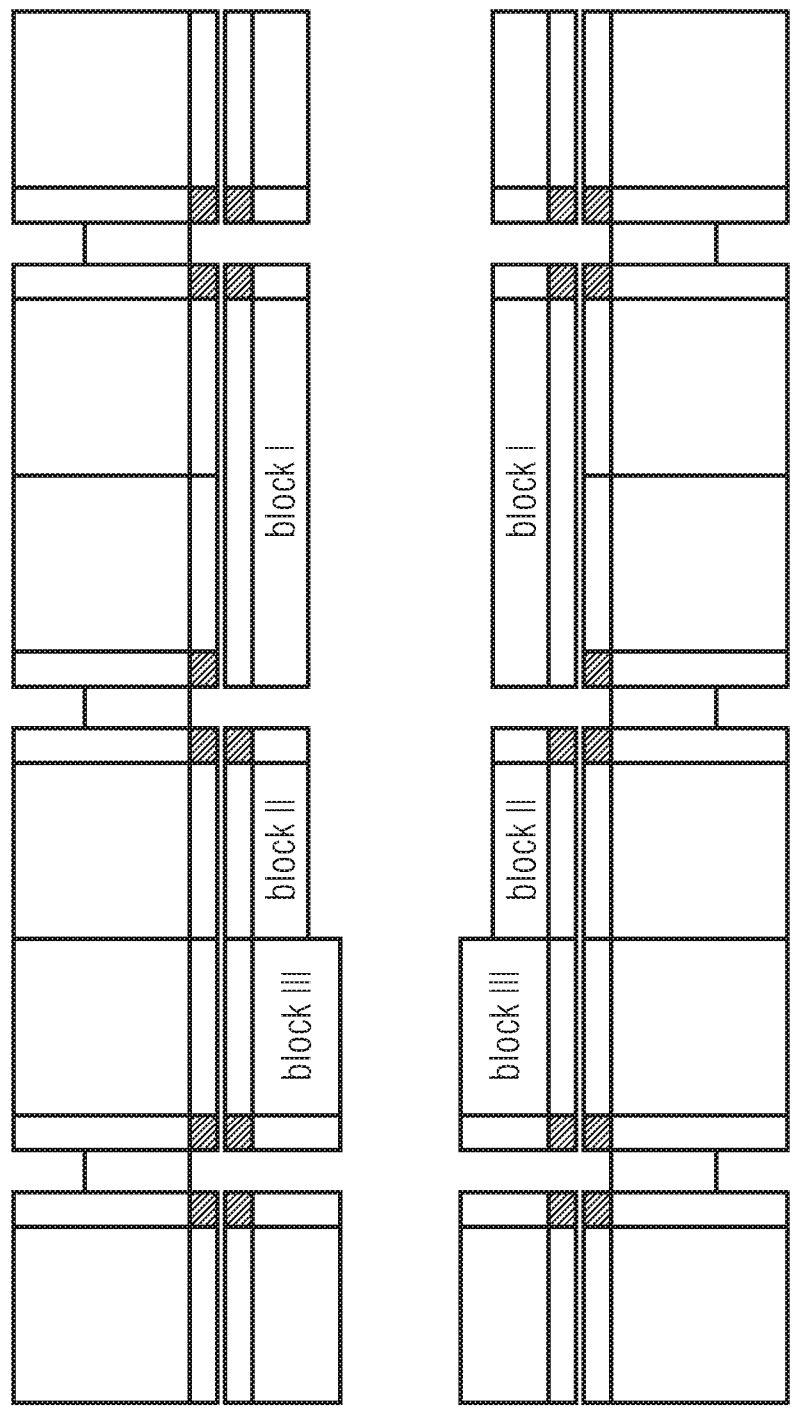
FIG. 15 illustrates a fourth layout structure of a memory module.

The truth table of FIG. 15 describes in detail how the selection of a memory sub banks DM take place in the three configurations illustrated in FIGS. 11 to 13. The selection of the memory sub banks is carried out based on the 5 row address bits RA[10:14], the row address bits are available simultaneously with the bank address bits BA so that no time loss occurs. As illustrated in truth table of FIG. 14 a memory sub bank is identified by <i, x, y>. "i" represents one of the 8 memory bank D[0:7] selected via decoding 3 row address bits BA[0:2]. "x" represents the half memory bank within the selected memory bank which is selected via the row address bit RA[14]. "y" is the identifier for distinguish the 3 groups of memory sub banks DM within the selected half memory bank, the group being selected via two row address bits RA[12, 13].

By subdividing the 128 Mbit half memory bank into three groups of 4 Mbit memory sub banks DM, one group including 16 4 Mbit memory sub banks and two groups including 8 4 Mbit memory sub banks, one group including 12 4 Mbit memory sub banks and two groups including 10 4 Mbit memory sub banks or one group including 8 4 Mbit memory sub banks and two groups including 12 4 Mbit memory sub banks an improved memory architecture is possible with respect to power network layout, pad deposition, data and control bus layout and packaging. The three independent groups of 4 Mbit memory sub banks DM each including a RIP corner, a RIP region and a JPC column enable a re-organization of the memory module layout to reduce area consumption. In one embodiment an unfavourable spine layout can be avoided and the length of the data bit line and the control bus lines can be reduced avoiding the need of re-drivers and gated control signals.

Figure 16:
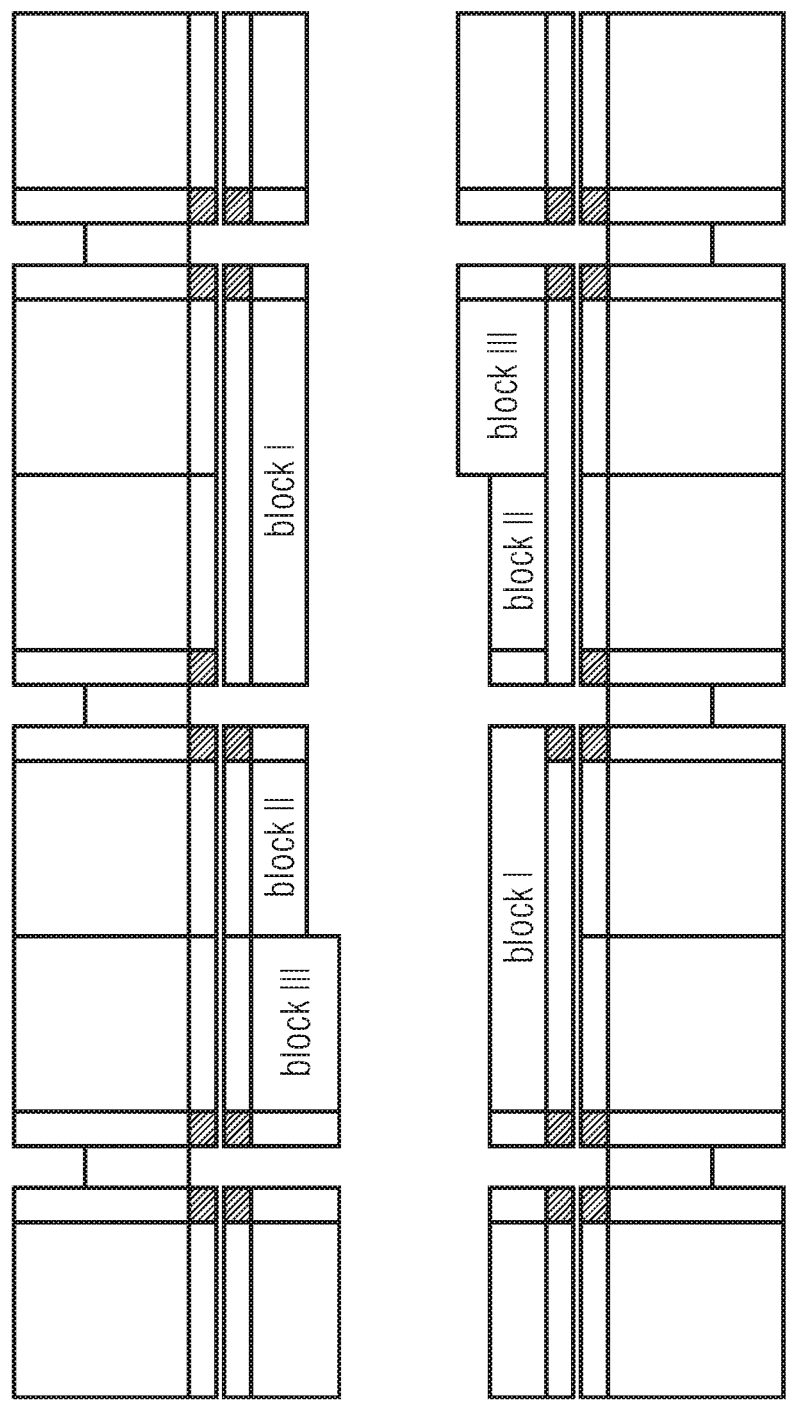
FIG. 16 illustrates a fifth layout structure of a memory module.
Figure 17:
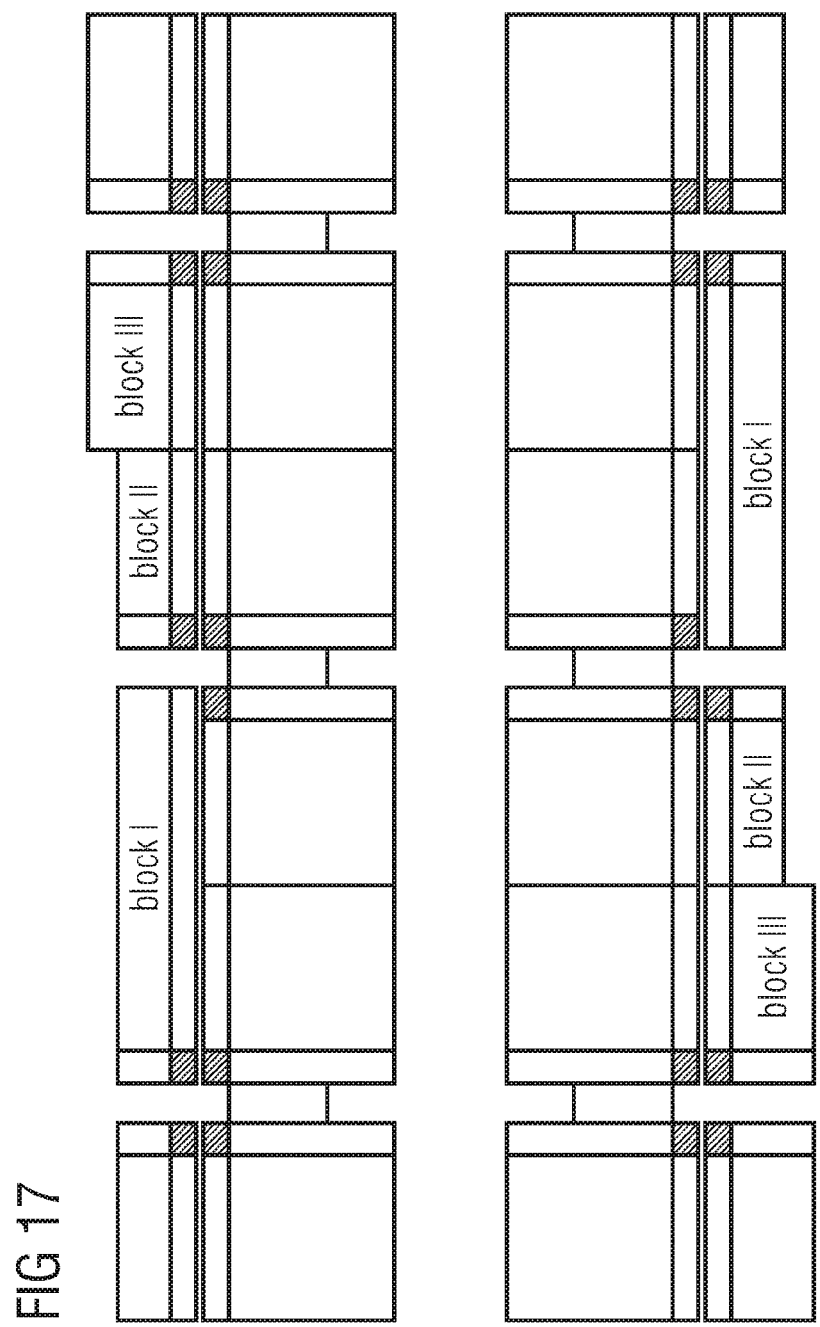
FIG. 17 illustrates a sixth layout structure of a memory module.

FIGS. 15 to 17 illustrates as examples for such a reorganization a fourth layout structure, a fifth layout structure and a second layout structure of the 2 Gbit memory module of FIG. 1, each having a special arrangement of group block 1, group block 2, group block 3 of two 128 Mbit half memory banks. According to fourth layout structure illustrated in FIG. 15 the two 128 Mbit half memory banks of a 256 Mbit memory bank are arranged on opposite sides and symmetrical to each other with respect to the spine, the memory sub bank groups block 3, block 2 and block 1 of each 128 half memory bank are arranged side by side. According to a fifth layout structure illustrated in FIG. 16 the two 128 Mbit half memory banks of a 256 Mbit memory bank are arranged point symmetrical with respect to the spine. According to the sixth layout structure illustrated in FIG. 16 the two 128 Mbit half memory banks of a 256 Mbit memory bank are located on opposite outsides of the memory module and are arranged point symmetrical. The layouts illustrated in FIGS. 15 to 17 are only examples to re-arrange the three memory sub bank groups of on 128 MBit half memory bank of the memory module.

The preceding description describes advantageous exemplary embodiments of the invention. The features disclosed therein and the claims and the drawings can, therefore, be useful for realizing the invention in its various embodiments, both individually and in any combination. While the foregoing is directed to embodiments of the present invention, other and further embodiments of this invention may be devised without departing from the basic scope of the invention, the scope of the present invention being determined by the claims that follow.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit including a memory module comprising:
   an even number of at least four memory banks, each memory bank having a plurality of memory cells, each memory bank comprising a column path region, each two memory banks forming a memory bank region and having a common data port, the column path region of each of the two memory banks including a data in/out connection to the common data port, the two memory banks of the memory bank region being alternately connected to a m-bit data bus via the common data port, each memory bank being subdivided into memory bank segments, each two memory bank segments forming a memory bank group and sharing a common data bus in the column path region to the common data port, the memory banks being classified into two groups, each group comprising a memory bank of each memory bank region; and
   a selection device, the selection device selecting one of the two groups of memory banks, and a group of i memory cells within one of the two memory bank segments of memory bank groups of the memory banks of the selected group of memory banks to access the selected i memory cells per one stroke via the associated m-bit data buses of the memory groups, m being equal to an integer multiple of i, and i and m being positive integers.

2. The integrated circuit of claim 1, further comprising a central data register connected between the respective m-bit data bus of each memory group and an n-bit data port, n being a positive integer.

3. The integrated circuit of claim 2, wherein n is equal to an integer multiple of m, the central data register buffering and transmitting an n-bit data packet between the n-bit data port and the m-bit data buses of the memory groups.

4. The integrated circuit of claim 1, wherein the selection device is responsive to selection bits and being operated in one of an m-bit mode and a m/2-bit mode to access the memory bank regions.

5. The integrated circuit of claim 1, wherein m is equal to 8.

6. The integrated circuit of claim 1, comprising:
   where the memory module comprises a donut architecture.

7. A memory module comprising:
   an even number of at least four memory banks, each memory bank having a plurality of memory cells, each memory bank comprising a column path region, each two of the memory banks forming a memory bank region and having a common data port, the column path region of each of the two memory banks including a data in/out connection to the common data port, the two memory banks of the memory bank region being alternately connected to a m-bit data bus via the common data port, each memory bank being subdivided into memory bank segments, each two memory bank segments forming a memory bank group and sharing a common data bus in the column path region to the common data port, the memory banks being classified into two groups, each group comprising a memory bank of each memory bank region; and
   a selection device connected to the memory banks and being responsive to selection bits, the selection device selecting one of the two groups of memory banks and a group of i memory cells within one of the two memory bank segments of memory bank groups of the memory banks of the selected group of memory banks to access the selected i memory cells per one stroke via the associated m-bit data buses of the memory groups including the selected memory banks, m being equal to an integer multiple of i, and i and m being positive integers.

8. The memory module of claim 7, further comprising a central data register connected between the respective m-bit data bus of each memory group and an n-bit data port, n being equal to an integer multiple of m, the central data register buffering and transmitting an n-bit data packet between the n-bit data port and the m-bit data buses of the memory groups, n being a positive integer.

* * * * *